United States Patent [19]

Umemura et al.

[11] Patent Number: 5,075,629
[45] Date of Patent: Dec. 24, 1991

[54] PARTIAL DISCHARGE DETECTING DEVICE FOR ELECTRICAL EQUIPMENTS

[75] Inventors: Tokihiro Umemura, Mie; Keiichi Abe, Kasugai, both of Japan

[73] Assignee: Kabushiki Kaisha Toshiba, Kanagawa, Japan

[21] Appl. No.: 469,141

[22] Filed: Jan. 24, 1990

[30] Foreign Application Priority Data

May 11, 1989 [JP] Japan .................................. 1-117886
May 11, 1989 [JP] Japan .................................. 1-117887

[51] Int. Cl.⁵ ............................................ G01R 31/06
[52] U.S. Cl. ..................................... 324/547; 340/646
[58] Field of Search ............... 324/546, 547, 536, 551, 324/552, 529; 340/646

[56] References Cited

U.S. PATENT DOCUMENTS

| | | | |
|---|---|---|---|
| 1,992,013 | 2/1935 | Palueff | 324/547 |
| 3,173,086 | 3/1965 | Kresge | 324/547 |
| 3,707,673 | 12/1972 | Carter | 324/547 |
| 3,801,899 | 4/1974 | Liao | 324/547 |
| 4,064,454 | 12/1977 | Yoshino et al. | 324/547 |
| 4,095,173 | 6/1978 | Darrel | 324/547 |
| 4,131,845 | 12/1978 | Pakulis | 324/640 |
| 4,446,420 | 5/1984 | Drouet | 324/529 |

Primary Examiner—Kenneth A. Weider
Assistant Examiner—Maura K. Regan
Attorney, Agent, or Firm—Shaw, Jr., Philip M.

[57] ABSTRACT

A partial discharge detecting device for transformers includes an antenna disposed in a metallic insulation gas filled tank enclosing a core and coil assembly and a signal processing circuit for processing an output signal from the antenna. The antenna includes a magnetic core and a single coil or two coils differently operated. An electromagnetic wave due to the partial discharge is detected by the antenna. A detection signal from the antenna is supplied to the signal processing circuit, which determines whether or not the partial discharge has taken place, based on the detection signal.

4 Claims, 4 Drawing Sheets

PARTIAL DISCHARGE DETECTING DEVICE FOR ELECTRICAL EQUIPMENTS

BACKGROUND OF THE INVENTION

This invention relates to a device for detecting a partial discharge taking place in electrical members to which a high voltage is applied, such as coils and connecting conductors, and more particularly to such a partial discharge detecting device for electrical equipments wherein an antenna is employed for detecting the partial discharge.

In transformers charged with a sulfur hexafluoride ($SF_6$) gas, for example, organic high polymers such as polyethylene telephtalate are sometimes employed as a material of member for insulating coils. However, such organic high polymers as polyethylene telephtalate are inferior against an electric discharge. Since there is a possibility of reduction of the insulation capacity of the insulating member upon occurrence of a partial discharge in the coil, a sufficient consideration is given to the transformer in its designing stage for prevention of occurrence of the partial discharge in the coil as much as possible.

However, it is desirable that when a long period use causes the partial discharge in the coil of the transformer, the partial discharge is coped with as soon as possible. As a result, various methods of and devices for detecting the partial discharge in the transformers have been presented. Japanese Laid-open Patent Application (Kokai) No. 57-80572 discloses a method of detecting the partial discharge based on both current pulses and sound produced with the partial discharge. Another Japanese Laid-open Patent Application (Kokai) No. 57-112232 discloses a method of detecting a corona discharge by detecting electromagnetic waves discharged with the corona discharge by way of a loop antenna.

In accordance with the above-mentioned conventional methods, the detection signal is at a low level and the noise level thereof is relatively high. Consequently, a circuit is needed for removing the noise from the detection signal, which complicates the over-all arrangement of the partial discharge detecting device.

SUMMARY OF THE INVENTION

Therefore, an object of the present invention is to provide an improved partial discharge detecting device for electrical equipments wherein a high level of signal-to-noise ratio can be ensured in the operation of detecting the partial discharge taking place in an electrical member of the electrical equipment, to which member a high voltage is applied.

The present invention provides a partial discharge detecting device for an electrical equipment including an electrical member to which a high voltage is applied, the electrical member being enclosed in a shielding case. The partial discharge detecting device comprises an antenna provided between the electrical member and the inner surface of the shielding case for detecting an electromagnetic wave, thereby generating an electrical signal in accordance with the detected electromagnetic wave, the antenna comprising a magnetic core and a coil wound around the magnetic core and determining means for determining the presence of the electromagnetic wave due to the partial discharge in the electrical member in response to the electrical signal generated by the antenna.

In accordance with the invention, when the partial discharge such as a corona discharge takes place in the electrical member owing to a high voltage, the electromagnetic wave due to the partial discharge is detected by the antenna, which generates the signal in accordance with the detected electromagnetic wave. The signal generated by the antenna is supplied to the determining means such as a frequency spectrum analyzer, thereby determining the presence of the electromagnetic wave due to the partial discharge in the electrical member.

Since the antenna comprises a magnetic core and a coil wound around the magnetic core, the responsibility of the detecting device against magnetic field components in the magnetic wave may be improved. Furthermore, since the antenna is disposed in the shielding case enclosing the electrical member in which the partial discharge takes place, detection of external electromagnetic waves as noise may be prevented.

Preferably, the partial discharge detecting device may further comprise sound detecting means disposed to detect the sound produced from the electrical member with the partial discharge, the sound detecting means generating an electrical signal in accordance with the detected sound and the determining means may determine the presence of the electromagnetic wave due to the partial discharge in the electrical member in simultaneous response to the electrical signals from both of the antenna and sound detecting means.

Since the sound is produced from the electrical member with occurrence of the partial discharge therein, the partial discharge detecting device discriminates the electromagnetic wave due to the partial discharge from the external electromagnetic wave as noise.

The invention may be practiced by the partial discharge detecting device for an electrical equipment including an electrical member to which a high voltage is applied, the electrical member being enclosed in a shielding case. The partial discharge detecting device comprises an antenna provided between the electrical member and the inner surface of the shielding case for detecting an electromagnetic wave, thereby generating an electrical signal in accordance with the detected electromagnetic wave, said antenna comprising a magnetic core and first and second coils wound around the magnetic core in the opposite directions to each other, a differential amplifier differentially amplifying two signals produced from the respective first and second coils in an opposite-phase relation to each other, and determining means for determining the presence of the partial discharge in the electrical member in response to the signals amplified by said differential amplifier.

The electromagnetic waves produced in the same and one portion of the electrical member as the result of the partial discharge are detected by the first and second coils of the antenna. The detection signals generated by the coils are differentially amplified in an opposite phase relation to each other. Consequently, the signals are amplified to those approximately twice as large as the detection signals.

It is preferable that one ends of the first and second coils having the same polarity are connected to an reference potential conductor or grounded. Consequently, the electrical signal as noise produced by the external electromagnetic waves in the leads of the coils are canceled at the stage of differential amplification, thereby improving the signal-to-noise ratio.

It is preferable that the determining means determines the presence of the partial discharge in the electrical member based on the electrical signals having frequencies ranging from 1 MHz to 100 MHz from among those generated by the antenna.

Other objects of the present invention will become obvious upon an understanding of the illustrative embodiment about to be described or will be indicated in the appended claims, and advantages not referred to herein will occur to one skilled in the art upon employment of the invention in practice.

DESCRIPTION OF THE PREFERRED EMBODIMENT

Several embodiments of the invention will now be described with reference to the accompanying drawings.

Figure 1:
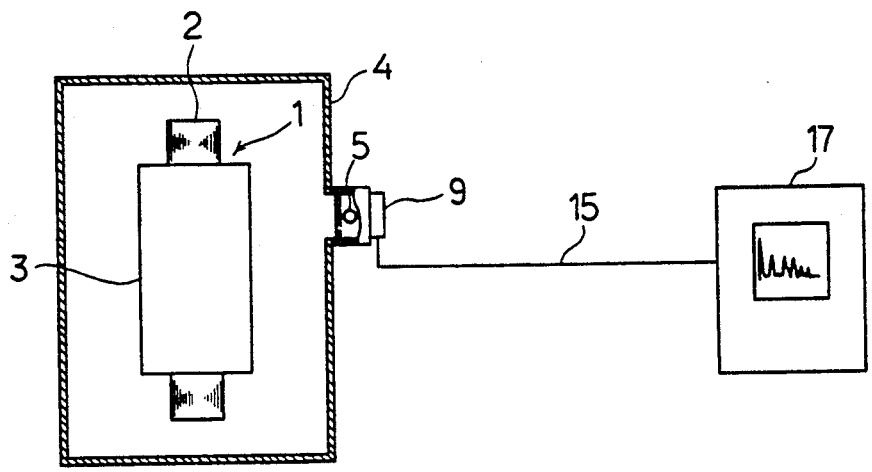
FIG. 1 is a block diagram illustrating the electrical arrangement of the partial discharge detecting device of a first embodiment in accordance with the invention.

Referring first to FIG. 1 showing a first embodiment, a core and coil assembly 1 of a transformer comprises an iron core 2 and a coil 3 wound around core 2 as an electrical member to which a high voltage is applied. Coil 3 is covered with an insulation member formed from polyethylene telephtalate, for example, for the purpose of insulation. Core and coil assembly 1 is contained in a metallic tank 4 as a shielding case and metallic tank 4 is grounded. Tank 4 is charged with a sulfur hexafluoride ($SF_6$) gas in the condition that core and coil assembly 1 is contained therein.

Figure 2:
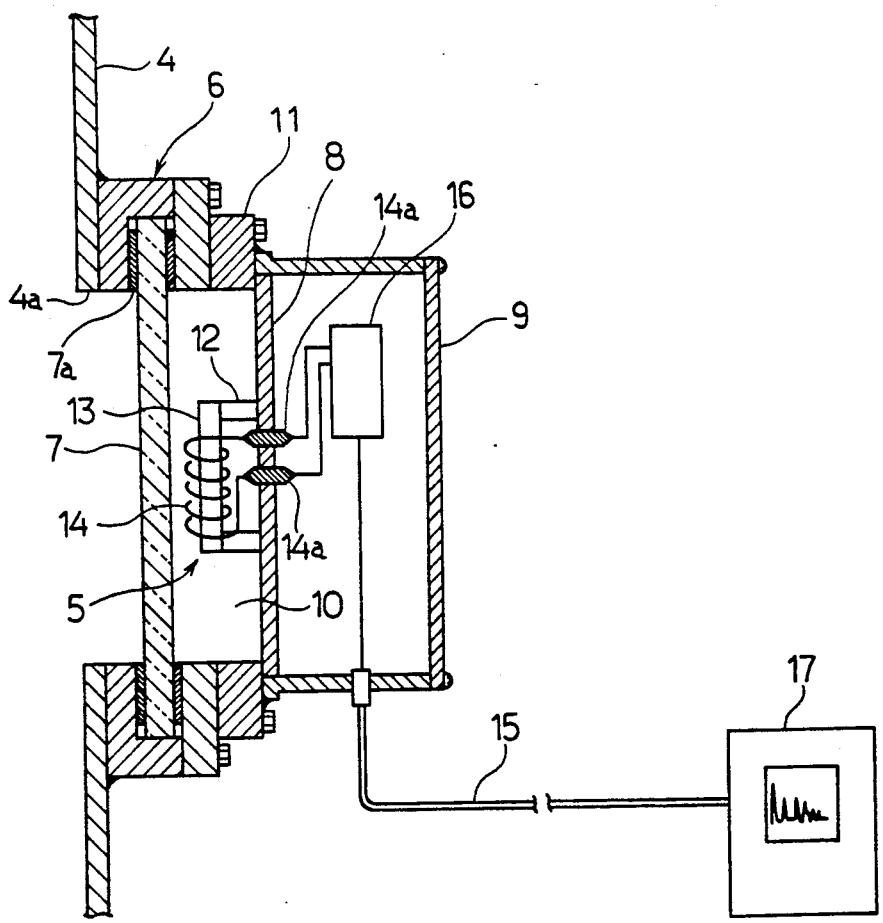
FIG. 2 is an enlarged longitudinal section of a major part of the device in FIG. 1.

An antenna 5 is disposed between the outer side of coil 3 and substantially the inner surface of tank 4. A small opening 4a is formed in the side wall of tank 4, as is shown in FIG. 2. Opening 4a is closed by a glass plate 7 as a non-magnetic and non-conductive closure member. Glass plate 7 is held in position by an iron flange assembly 6 fixed to the peripheral edge thereof. A packing 7a is applied between flange assembly 6 and glass plate 7, thereby sealing the space therebetween. A mounting plate 8 as an aluminum cover member forms a side wall of an aluminum box 9. Mounting plate 8 is fixed to flange assembly 6 through an aluminum flange 11 so as to define an enclosed space 10 with glass plate 7. Antenna 5 comprises a magnetic core 13 mounted on mounting plate 8 with two chloroethylene mounting seats 12 interposed therebetween and a coil 14 wound around core 13. Both ends of coil 14 are connected to inputs of a preamplifier 16 provided in box 9 through electrical terminals 14a provided on mounting plate 8. Output of preamplifier 16 is connected by a cable 18 to a frequency analyzer 17 as means for determining the presence of an electromagnetic wave. A small voltage signal is inputted to preamplifier 16 which amplifies the small voltage signal. An amplified signal is supplied to spectrum analyzer 17 which measures the frequency distribution of the signal.

Operation of the above-described partial discharge detecting device will now be described.

When a partial discharge like a corona discharge takes place in coil 3 during operation of the transformer, an electromagnetic wave having a frequency band ranging from 1 MHz to 100 MHz is emitted in tank 4. The electromagnetic wave reaches antenna 5 through glass plate 7 and is interlinked with the antenna. A voltage signal in accordance with intensity of the interlinked electromagnetic wave is induced at coil 14 of antenna 5. The voltage signal is supplied to preamplifier 16 which amplifies it. The amplified voltage signal is supplied to spectrum analyzer 17. Consequently, the signal of the frequency band ranging from 1 MHz to 100 MHz appears at higher level than those of the other frequency bands. When an operator views the result presented by spectrum analyzer 17, thereby determining whether or not the partial discharge has taken place in coil 3.

Tank 4 is formed from a metallic material as described above and accordingly, external noise or external electromagnetic wave is prevented from transferring to the interior of tank 4. Consequently, the external electromagnetic wave does not reach antenna 5 disposed in tank 4 and the detection signal generated by antenna 5 may be prevented from being affected by the external electromagnetic wave.

Furthermore, since antenna 5 comprises magnetic core 13 and coil 14 wound around the core 13, the level of the detection signal generated in accordance with the electromagnetic wave due to the partial discharge is high as compared with that in the prior art and the detection sensitivity is also high.

Figure 3:
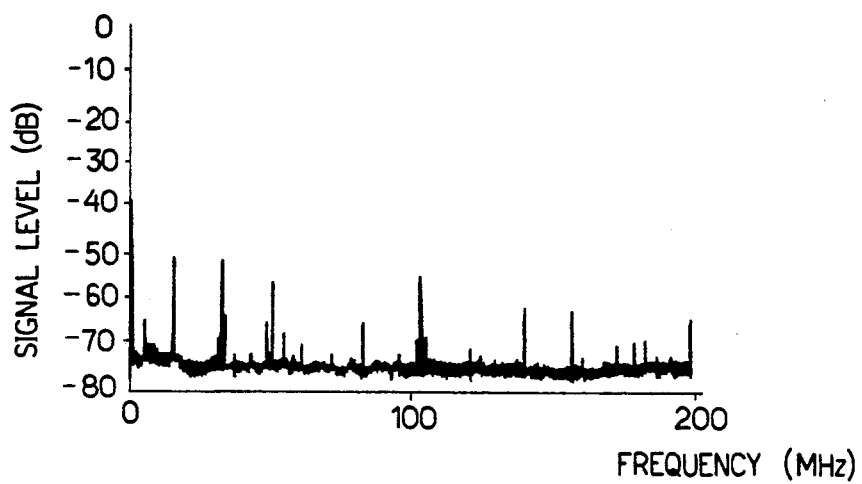
FIG. 3 shows a frequency spectrum as the result of measurement of the partial discharge.
Figure 4:
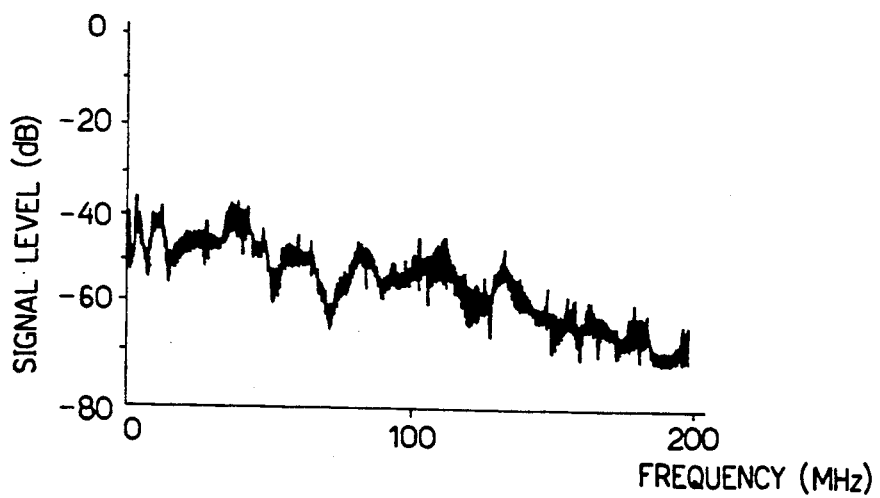
FIG. 4 is a view similar to FIG. 3 in the peak holding condition.

The inventors made an experiment wherein the frequency distribution of the electromagnetic wave due to the artificial partial discharge in coil 3. The result of the experiment is shown in FIGS. 3 and 4. FIG. 3 illustrates the frequency distribution presented by spectrum analyzer 17 in the real time mode. FIG. 4 illustrates the maximum value in the peak holding mode wherein the maximum value in the real time mode is held for a minute. FIGS. 3 and 4 show that the electromagnetic wave due to the partial discharge (signal level from −40 to −70 dB) occurs in the measured frequency band ranging from 1 MHz to 200 MHz. In this case, an amount of electric charge with the partial discharge is approximately 200 pc. The inventors then examined from the experimental result shown in FIG. 4 the tendency of the frequency distribution due to the partial discharge from FIG. 4. Although the electromagnetic wave due to the partial discharge occurs in the frequency band ranging from 100 MHz to 200 MHz, the signal level is lowered as the frequency is increased. Accordingly, the electromagnetic waves with the partial discharge in the coil may be detected with accuracy by measuring the signals levels in the frequency band ranging from 1 MHz to 100 MHz.

Figure 5:
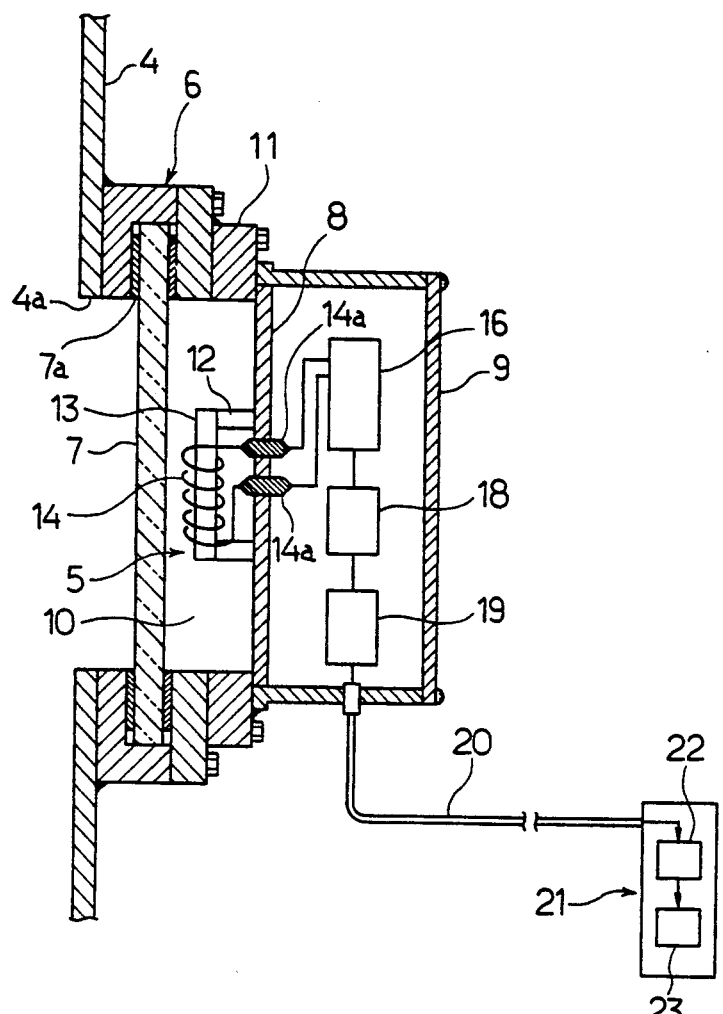
FIG. 5 is a view similar to FIG. 2 illustrating a modified form of the device in FIG. 1.

FIG. 5 illustrates a modified form of the partial discharge detecting device of the above-described first embodiment. An analog-to-digital (A/D) converter 18 for converting the analog detection signal generated by preamplifier 16 to a corresponding digital signal and an photoelectric converter 19 for converting the digital signal generated by A/D converter 18 to a corresponding optical signal are provided in box 9. The optical signal generated by photoelectric converter 19 is supplied through an optical fiber cable 20 to a display unit 21 serving as means for determining the presence of the electromagnetic wave. Display unit 21 includes another photoelectric converter 22 for converting the optical detection signal supplied thereto through optical fiber cable 20 to a corresponding digital electrical signal and a digital display 23 displaying an amount of the detected electromagnetic wave.

Figure 6:
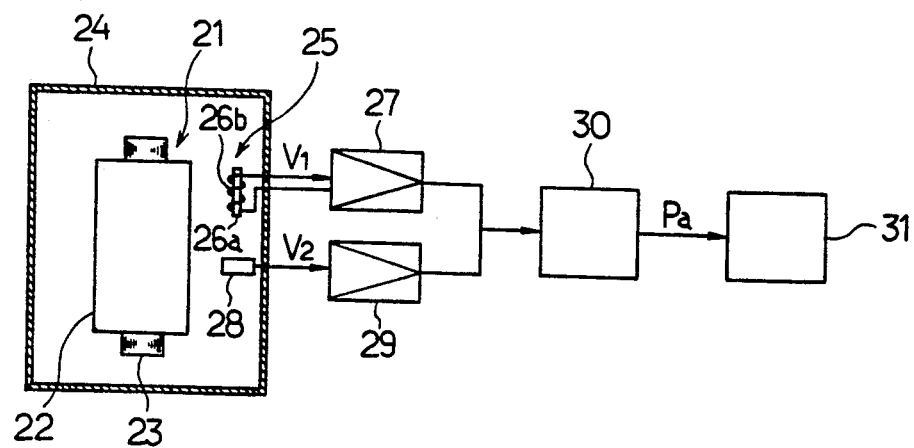
FIG. 6 is a view similar to FIG. 1 illustrating the partial discharge detecting device of a second embodiment.

FIG. 6 illustrates a second embodiment of the invention. A core and coil assembly 21 of the transformer comprises an iron core 23 and a coil 22 covered with polyethylene telephtalate for insulation and wound around core 23. Core and coil assembly 21 is enclosed in a tank 24 filled with sulfur hexafluoride ($SF_6$). Tank 24 is formed from a metallic material having an electromagnetic wave shielding property and grounded.

An antenna 25 and a microphone 28 as sound detecting means are provided in the vicinity of coil 22 of core and coil assembly 21. Antenna 25 comprises a bar-shaped magnetic core 26a and a coil 26b wound around core 26a. Antenna 25 generates a voltage signal V1 in accordance with change of the magnetic field interlinked with coil 26b and the voltage signal is supplied to an amplifier 27. Microphone 28 generates a sound signal V2 in accordance with the level of the received sound and the sound signal V2 is supplied to another amplifier 29. Both the voltage signal V1 amplified by amplifier 27 and the sound signal V2 amplified by amplifier 29 are supplied to a partial discharge detecting circuit 30 which measures the levels of the signals. When the level of each signal exceeds a predetermined level, partial discharge detecting circuit 30 generates an abnormal condition signal Pa, which is supplied to an abnormal condition display 31. Upon receipt of the abnormal condition signal Pa, abnormal condition display 31 is operated to indicate that the partial discharge has occurred in the coil of the transformer.

In operation, when the partial discharge takes place in coil 22 of core and coil assembly 21 during operation of the transformer, the electromagnetic wave is produced with the partial discharge. Since magnetic field component of the electromagnetic wave concentrates upon magnetic core 26 of antenna 25, antenna 25 generates the voltage signal V1 in accordance with changes of the magnetic field components of the electromagnetic wave and the voltage signal V1 is supplied through amplifier 27 to partial discharge detecting circuit 30.

When the partial discharge takes place in coil 22, sound is produced from coil 22 with the partial discharge. The sound is received by microphone 28, which generates the sound signal V2 in accordance with the received sound. The sound signal V2 is supplied through amplifier 29 to partial discharge detecting circuit 30.

Partial discharge detecting circuit 30 measures the levels of voltage signal V1 from antenna 25 and sound signal V2 from microphone 28. When levels of both signals simultaneously exceed a predetermined level, partial discharge detecting circuit 30 generates an abnormal condition signal Pa, which is supplied to abnormal condition display 31. Abnormal condition display 31 is operated to indicate that the partial discharge has occurred in coil 22. When viewing the displayed content of abnormal condition display 31, the operator recognizes the occurrence of the partial discharge in coil 22.

When a high level electromagnetic wave as noise intrudes into tank 24 which prevents the external electromagnetic wave from passing therethrough, for some reason, or when the electromagnetic wave is emitted from an electric power supply line, the electromagnetic wave is interlinked with antenna 25 and the voltage signal V1 having the level exceeding the predetermined level is occasionally generated. However, partial discharge detecting circuit 30 is not operated by mistake. More specifically, since the sound due to the partial discharge is not produced from coil 22 when the partial discharge does not take place in the coil 22, the level of the sound signal V2 generated by microphone 28 does not exceed the predetermined level. Accordingly, even when the level of the voltage signal V1 from antenna 25 exceeds the predetermined level, the abnormal condition signal Pa is not generated by partial discharge detecting circuit 30 as the level of the sound signal V2 supplied from microphone 28 to circuit 30 is low. Consequently, abnormal condition display 31 is not operated to indicate the occurrence of the partial discharge, thereby preventing partial discharge detecting circuit 30 from the false operation.

Furthermore, when microphone 28 receives external noise in the condition that the partial discharge has not taken place in coil 22, the level of the sound signal V2 generated by microphone 28 occasionally exceeds the predetermined level. In such a case, however, the level of the voltage signal V1 generated by antenna 25 does not exceed the predetermined level and accordingly, partial discharge detecting circuit 30 is prevented from the false operation, too.

Figure 7:
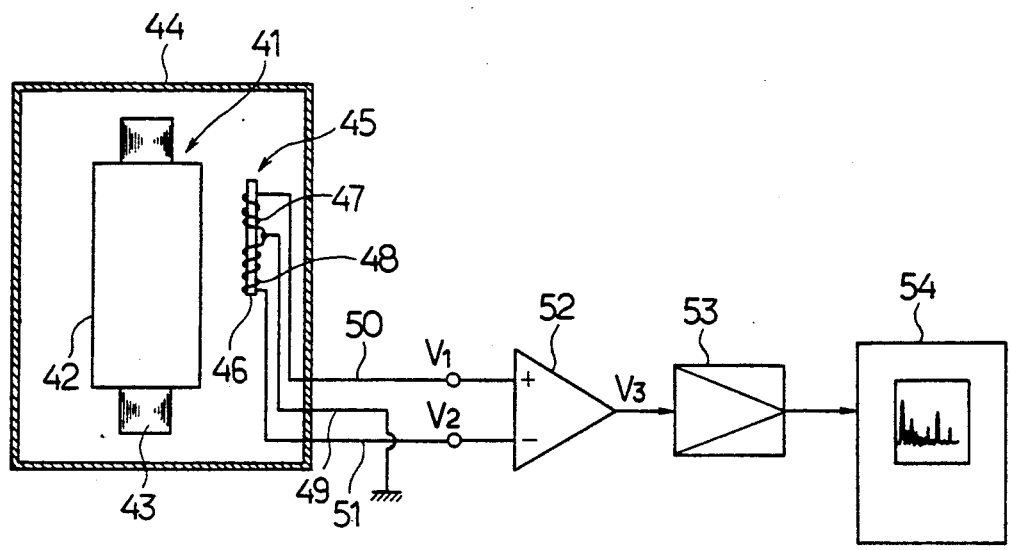
FIG. 7 is a view similar to FIG. 1 illustrating the partial discharge detecting device of a third embodiment.
Figure 8:
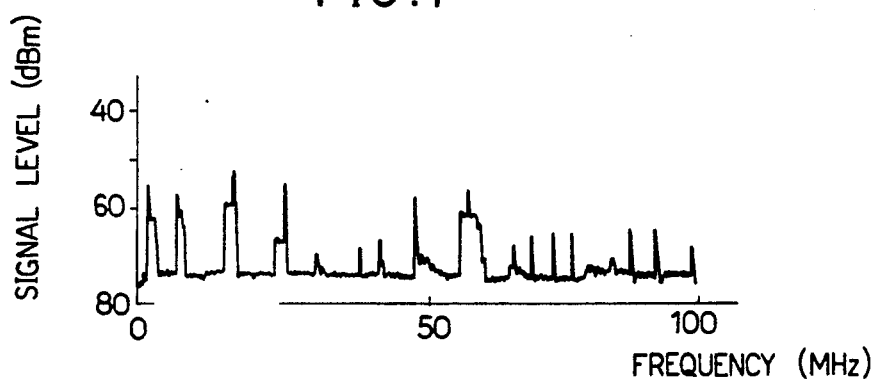
FIG. 8 is a view similar to FIG. 3 showing the result of measurement of the electromagnetic waves by way of a differential detection in the third embodiment.
Figure 9:
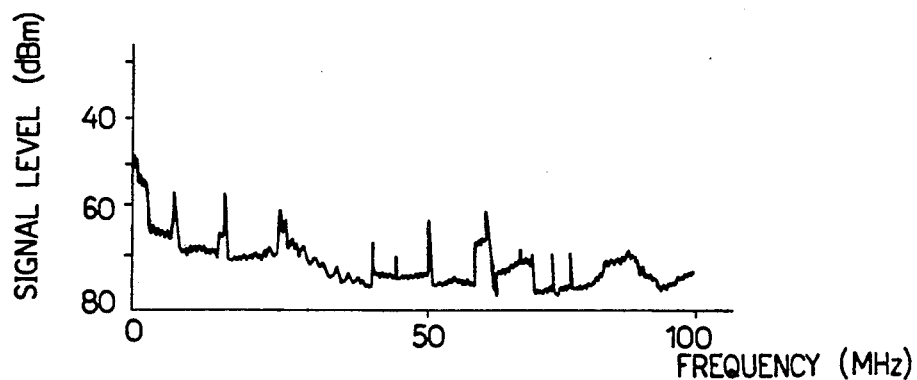
FIG. 9 is a view similar to FIG. 8 showing the case where the differential detection is not employed.

FIGS. 7 to 9 illustrate a third embodiment of the invention. Referring to FIG. 7, a core and coil assembly 41 of the transformer comprises an iron core 43 and a coil 42 wound around core 43. Coil 42 is covered with, for example, polyethylene telephtalate for insulation. Core and coil assembly 41 is contained in tank 44 filled with sulfur hexafluoride ($SF_6$) Tank 44 comprises a shield member having an electromagnetic wave shielding property. Antenna 45 is disposed in the vicinity of coil 42. Antenna 45 comprises a generally bar-shaped magnetic core 46 and first and second coils 47 and 48 both wound around core 46. First and second coils 47 and 48 are wound up in the opposite directions to each other at the same turns and series connected. The common junction of coils 47 and 48 or one ends of the coils having the same polarity is extended outside tank 44 through a reference potential (0 volts) line 49. The other ends of coils 47 and 48 are extended outside tank 44 through first and second leads 50 and 51, respectively. Consequently, first and second voltage signals V1 and V2 are generated by first and second coils 47 and 48 in accordance with changes of the magnetic field as the result of interlinkage of antenna 45 with the electromagnetic wave. Reference potential line 49 and first and second leads 50 and 51 are connected to a partial discharge detecting circuit 52 comprising a differential amplifier for performing the differential signal detection. Partial discharge detecting circuit 52 detects a voltage signal V3 as the difference voltage between the first and second voltage signals V1 and V2 supplied thereto through respective leads 50 and 51. The output of partial discharge detecting circuit 52 is connected to an amplifying circuit 53 which amplifies the voltage signal V3 supplied from partial discharge detecting circuit 52. The amplified voltage signal V3 is supplied to a spectrum analyzer 54 which measures the frequency distribution of the voltage signal V3 and displays the distribution characteristics.

In operation, when the partial discharge takes place in the coil 42 during operation of the transformer, the electromagnetic wave having the frequency ranging mainly from 1 MHz to 100 MHz is emitted from the coil 42. The electromagnetic wave from the coil 42 reaches antenna 45 and is interlinked therewith. Since the magnetic field components of the electromagnetic wave concentrate upon magnetic core 46 of antenna 45, first and second voltage signals V1 and V2 in accordance with changes in magnitude of magnetic field components concentrated upon magnetic core 46 are generated by first and second coils 47 and 48, respectively. The first and second voltage signals V1 and V2 are supplied to partial discharge detecting circuit 52. Since the coils are wound in the opposite directions to each other at the same number of turns, first and second voltage signals V1 and V2 generated by respective coils 47 and 48 are in a 180 out-of-phase relation relative to reference potential line 49 and have the same signal level. Accordingly, partial discharge detecting circuit 52 performs the differential amplification wherein one of voltage signals V1 and V2 is subtracted from the other with the polarity of one of the voltage signals reversed. As a result, the obtained difference voltage V3 is equivalent to the amplified value twice the absolute value of either of voltages V1 and V2. The voltage signal amplified by amplifying circuit 53 is supplied spectrum analyzer 54. When the signal level in the frequency band ranging from 1 MHz to 100 MHz is intensely indicated by spectrum analyzer 54, the occurrence of the partial discharge in coil 42 is perceived.

When the transformer employs tank 44, it prevents the external electromagnetic wave from passing therethrough to some extent. However, when such a tank is not employed in the transformer such as a molded-coil transformer or when a strong electromagnetic wave intrudes into tank 44 even though tank 44 is employed, the electromagnetic wave is interlinked with first and second leads 50 and 51. First and second voltage signals Vn1 and Vn2 in accordance with the magnitude of the magnetic field components of the electromagnetic wave are generated at leads 50 and 51, respectively. However, the first and second voltage signals are in phase relative to the reference potential line 49. Accordingly, when the difference voltage between the voltage signals Vn1 and Vn2 are obtained by partial discharge detecting circuit 52, the voltage signals Vn1 and Vn2 are offset to be reduced. Consequently, even when the electromagnetic wave as noise is interlinked with first and second leads 50 and 51, detection of the partial discharge may be performed without affection of the noise.

The inventors made another experiment under the condition different from that in the experiment shown in FIG. 8. In the experiment, the frequency distribution of the electromagnetic wave is measured by spectrum analyzer 54 in the condition that the partial discharge of approximately 100 pc is caused to artificially take place in coil 42. FIG. 8 shows the result of measurement. Further, FIG. 9 shows the result of measurement of the detection signals obtained by the antenna comprising a single coil as illustrated in FIG. 1 or a magnetic sensor not employing the differential detection.

As obvious from FIG. 8, the components of frequency resulting from the partial discharge may be distinguished from the noise components in the frequency band ranging up to 100 MHz. However, in the case of the magnetic sensor not employing the differential detection, the components of frequency resulting from the partial discharge are affected by the noise electromagnetic wave and the noise components are increased, as shown in FIG. 9. As a result, it is difficult to distinguish the components of frequency due to the partial discharge from the noise components, resulting in low noise proof characteristics. More specifically, employment of the differential detection provides substantial improvement of the noise proof characteristics.

Although the partial discharge detecting device is employed for the detection of partial discharge taking place in the coil of a gas filled transformer in the foregoing embodiments, the device may be employed for the detection of the partial discharge taking place in the electrical members to which a high voltage is applied, such as oil filled transformers, rotating machine, reactors, connecting conductors of molded coil transformers.

The foregoing disclosure and drawings are merely illustrative of the principles of the present invention and are not to be interpreted in a limiting sense. The only limitation is to be determined from the scope of the appended claims.

What we claim is:

1. A partial discharge detecting device for an electrical equipment including an electrical member to which a high voltage is applied, the electrical member being enclosed in a shielding case, said device comprising:
   a) an antenna provided between the electrical member and the inner surface of the shielding case for detecting an electromagnetic wave having frequencies ranging from 1 MHz to 100 MHz, thereby generating an electrical signal in accordance with the intensity of the detected electromagnetic wave, said antenna comprising a magnetic core and a coil wound around the magnetic core; and
   b) determining means for determining the presence of the electromagnetic wave due to the partial discharge in response to the electrical signal generated by said antenna.

2. A partial discharge detecting device for an electrical equipment including an electrical member to which a high voltage is applied, the electrical member being enclosed in a shielding base, said device comprising:
   a) an antenna provided between the electrical member and the inner surface of the shielding case for detecting an electromagnetic wave, thereby generating an electrical signal in accordance with the intensity of the detected electromagnetic wave, said antenna comprising a magnetic core and first and second coils wound around the magnetic core in the opposite directions to each other;
   b) a differential amplifier for composing two signals produced from the respective first and second coils, in an in-phase relation to each other and amplifying a resultant composite signal, whereby magnetic field component signals contained in the respective signals are added to each other and electric field component signals are canceled by each other; and c) determining means for determining the presence of the partial discharge due to the partial discharge in the electrical member in response to the signals amplified by said differential amplifier.

3. A partial discharge detecting device for a transformer including a casing having a side wall and enclosed in a metallic tank with an electrical insulator, said device comprising:

a) a member for defining an opening in the side wall of the tank;

b) a closure member formed from a non-conductive material and provided to close the opening defined by said defining member;

c) a cover member formed from a metallic and provided outside the tank so as to form an enclosed space with said closure member;

d) an antenna provided in the enclosed space for detecting an electromagnetic wave traveling from the inside of the tank through said closure member, thereby generating an electrical signal in accordance with the intensity of the detected electromagnetic wave, said antenna comprising a magnetic core and a coil wound around the magnetic core; and e) determining means for determining the presence of the electromagnetic wave due to the partial discharge in the electrical member in response to the electrical signal generated by said antenna.

4. A partial discharge detecting device for a transformer including a casing having a side wall and enclosed in a metallic tank with an electrical insulator, said device comprising:

a) a member for defining an opening in the side wall of the tank;

b) a closure member formed from a non-conductive material and provided to close the opening defined by said defining member;

c) a cover member formed from a metallic and provided outside the tank so as to form an enclosed space with said closure member;

d) a metallic box disposed adjacent said cover member;

e) an antenna provided in the enclosed space for detecting an electromagnetic wave traveling from the inside of the tank through said closure member, thereby generating an analog signal in accordance with the intensity of the detected electromagnetic wave, said antenna comprising a magnetic core and a coil wound around the magnetic core;

f) analog-to-digital conversion means provided in said metallic box for converting the analog signal generated by said antenna to a corresponding digital signal;

g) first photoelectric conversion means provided in said metallic box for converting the digital signal generated by said analog-to-digital conversion means to a corresponding optical signal;

h) an optical fiber cable disposed outside the tank and having two ends one of which is held at the metallic box side, said optical fiber cable transmitting the optical signal generated by said first photoelectric conversion means;

i) second photoelectric conversion means connected to the other end of said optical fiber cable for converting the optical signal transmitted through said optical fiber cable to a corresponding electrical signal; and j) means for displaying data on the presence of the electromagnetic wave in response to the electrical signal generated by said second photoelectric conversion means.

* * * * *